(12) United States Patent
Vacher

(10) Patent No.: US 6,788,069 B2
(45) Date of Patent: Sep. 7, 2004

(54) METHOD FOR CALCULATING THE PARAMETERS OF THE POWER BATTERY OF AN ELECTRIC MOTOR VEHICLE

(75) Inventor: Cécile Vacher, Asniere (FR)

(73) Assignee: Peugeot Citroen Automobiles SA, Neuilly sur Seine (FR)

( * ) Notice: Subject to any disclaimer, the term of this patent is extended or adjusted under 35 U.S.C. 154(b) by 21 days.

(21) Appl. No.: 10/212,997

(22) Filed: Aug. 5, 2002

(65) Prior Publication Data
US 2003/0034780 A1 Feb. 20, 2003

(30) Foreign Application Priority Data
Aug. 10, 2001 (FR) .............................. 01 10704

(51) Int. Cl.[7] .............................. G01N 27/416
(52) U.S. Cl. .................... 324/430; 324/426; 320/162
(58) Field of Search ..................... 180/65.8, 65.3, 180/302; 320/162, 134; 324/426, 427, 430, 431, 433, 435, 444; 702/63–65, 183, 184, FOR 103, FOR 105; 340/636.1, 636.11, 636.13, 455, 438, 636.12; 123/2

(56) References Cited

U.S. PATENT DOCUMENTS

| | | | | |
|---|---|---|---|---|
| 4,325,010 A | * | 4/1982 | Lowndes | 318/139 |
| 4,423,378 A | * | 12/1983 | Marino et al. | 324/427 |
| 4,876,513 A | * | 10/1989 | Brilmyer et al. | 324/427 |
| 4,968,942 A | | 11/1990 | Palanisamy | 324/430 |
| 5,428,560 A | | 6/1995 | Leon et al. | 703/13 |
| 5,765,656 A | * | 6/1998 | Weaver | 180/65.3 |
| 5,936,383 A | | 8/1999 | Ng et al. | 360/244.6 |

FOREIGN PATENT DOCUMENTS

EP 1081499 A1 3/2001

OTHER PUBLICATIONS

Search Report, Apr. 5, 2002.

* cited by examiner

Primary Examiner—N. Le
Assistant Examiner—Vincent Q. Nguyen
(74) Attorney, Agent, or Firm—RatnerPrestia

(57) ABSTRACT

The invention relates to a method for determining at least one operating parameter of the power battery of a vehicle having an electric traction motor. The battery parameter includes at least one of the following parameters: charging capacity, discharge power, state of overcharge or state of total discharge. The power battery's internal resistance and the intensity of the current supplied or received are determined in order to calculate the parameter(s). This internal resistance is calculated, for example, using a low voltage auxiliary battery.

14 Claims, 2 Drawing Sheets

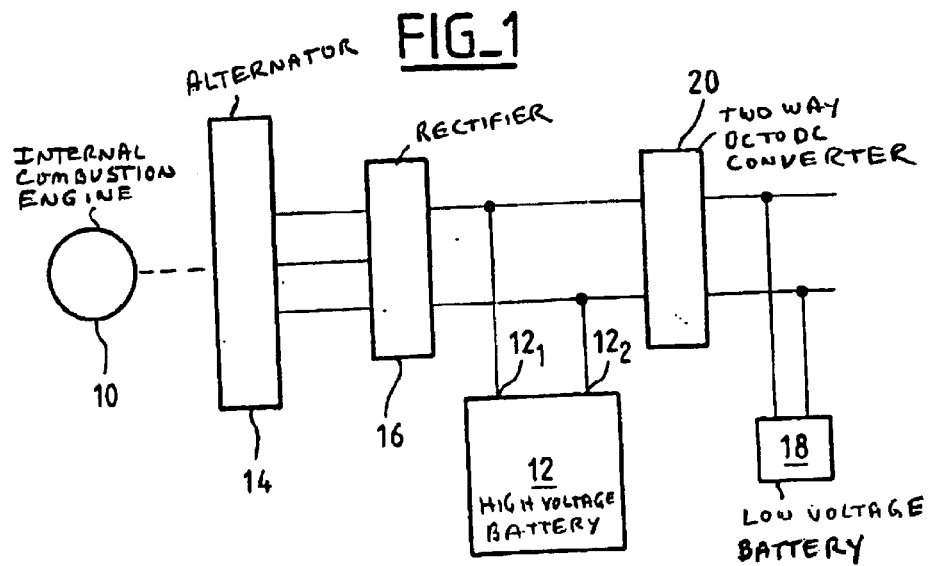
FIG_1
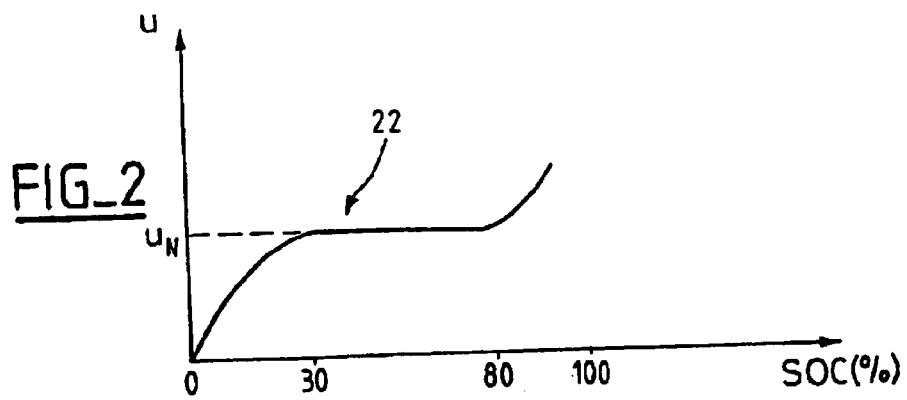
FIG_2
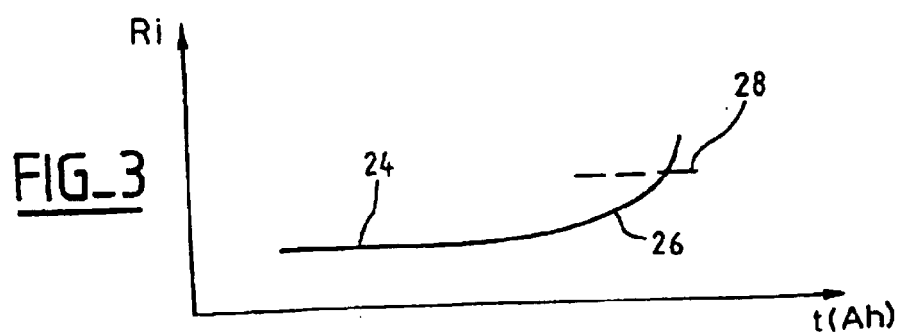
FIG_3

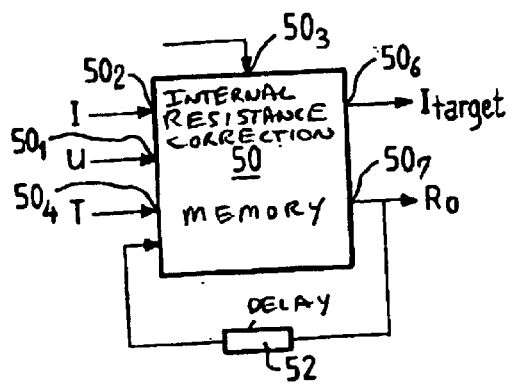
FIG_4a
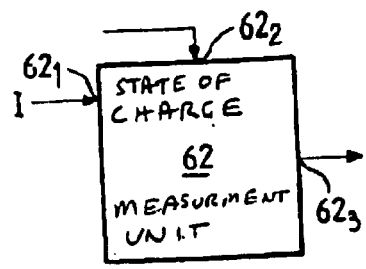
FIG_4b
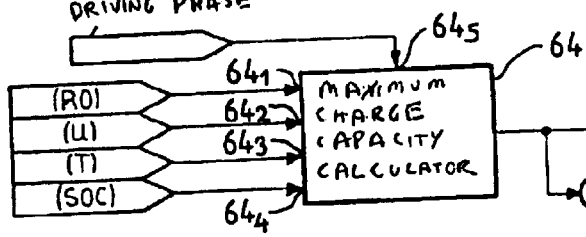
FIG_4c
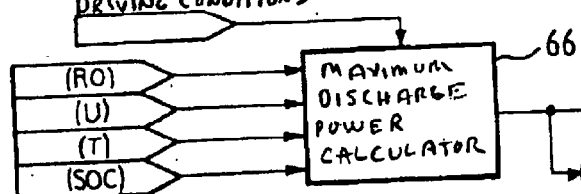
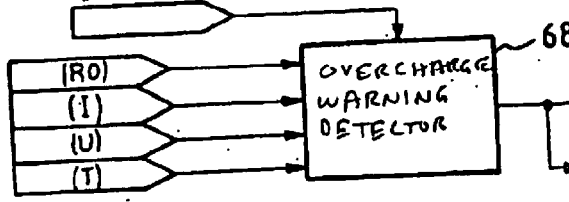
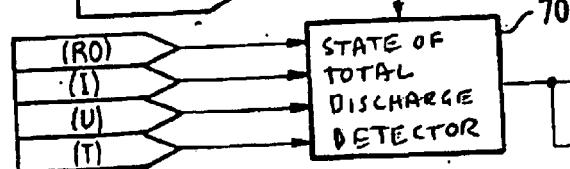
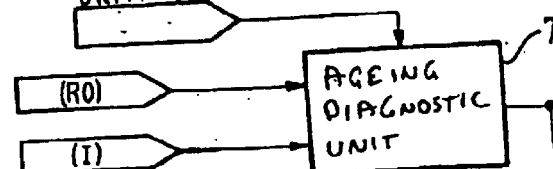

METHOD FOR CALCULATING THE PARAMETERS OF THE POWER BATTERY OF AN ELECTRIC MOTOR VEHICLE

FIELD OF THE INVENTION

The present invention relates to a method and a device for calculating the parameters of a rechargeable direct current generator, or accumulator battery, for supplying power to an electric motor for a motor vehicle.

BACKGROUND OF THE INVENTION

It relates in particular, but not exclusively, to a method and a device for calculating the parameters of a power battery for a hybrid type vehicle.

Let it be noted here that a hybrid motor vehicle comprises an internal combustion engine to drive the vehicle on the one hand and on the other hand, an electric motor powered by a battery. The internal combustion engine serves not only to propel the vehicle but also to turn an alternator which charges the power battery via a current rectifier. The decision to control the movement of the vehicle, either by the internal combustion engine, or by the electric motor, or by both at the same time, is usually made automatically according to the state of charge of the battery and the discharge power of the battery, among other things. Starting and stopping battery charging are also carried out automatically by means of equipment for detecting total discharge and overcharge.

Adding together the electricity supplied and the electricity received (in ampere-hours) in order to determine the state of charge of a power battery is known. This sum can also be used to determine the power battery's state of ageing.

The battery's state of charge is expressed as a % of the maximum charge. For states of charge between approximately 30% and 80%, the voltage supplied by the battery has a definite value. However, for states of charge lower than approximately 30%, the voltage supplied decreases with the state of charge and, similarly, for states of charge above approximately 80%, the voltage increases with the state of charge.

Overcharge detection consists of comparing the battery output voltage at zero current with a first threshold value and cutting off the charging and/or triggering an overcharge warning when the voltage exceeds this first threshold value.

In the same way, detection of total discharge of the battery is carried out by comparing the battery's voltage at zero current with a second threshold value, charging and/or a discharge warning being triggered when the battery voltage drops below this second threshold value.

The invention is the result of the observation that the known method for calculating the charging capacity and discharge power and the methods for detecting states of overcharge and total discharge are not accurate enough for correct management of the battery and propulsion of the vehicle. For example, inaccurate calculation of the battery's discharge power makes it impossible to determine with certainty whether the electric motor will be able, together with the internal combustion engine, to supply enough torque to provide the driving force required by the driver. For another example, inaccurate information about the overcharge or the state of total discharge may cause random triggering of warnings.

SUMMARY OF THE INVENTION

To overcome these disadvantages, the invention provides for determining the internal resistance of the battery and making use of this internal resistance to determine at least one of the following parameters: charging capacity calculation; discharge power calculation; overcharge detection and total discharge detection.

Thus, the battery's charging capacity and discharge power can be determined by equation (1).

$$P = UI = U \frac{E \pm U}{R} \tag{1}$$

In this formula, U is the voltage at the battery terminals, E is the electromotive force (discharging), or back electromotive force (charging), R is the battery's internal resistance and I is the measured intensity of the output current (discharging) or input current (charging). In addition, in this formula the + sign refers to charging and the − sign to discharging.

Th voltage U can be measured directly. On the other hand, parameter E is calculated from correlation table, loaded in memory in the factory, showing the relationship between value E and the state of charge (in %), calculated by adding together the electricity received or supplied, and the temperature of the battery, if necessary. The resistance R of the battery is measured and, preferably, corrected, as explained hereinafter.

The single or double entry correlation table is established empirically, for example, using measurements made on a large number of batteries of the same type and same specifications as the one installed in the vehicle.

To determine the threshold $U_{max}$ for overcharge detection, the relationship shown in equation (2) can be used:

$$U_{max} = E_{90\%} + R_{90\%} I. \tag{2}$$

In this formula, $E_{90\%}$ and $R_{90\%}$ are the battery's back electromotive force and its internal resistance for a state of charge of the order of 90%, respectively. Of course, the value of 90% used for the state of charge is an example of a state of charge for which the back electromotive force is higher than the back electromotive force for a normal state of charge (usually between 30% and 80% as mentioned above).

The expressions $U_{max}$, I and, generally speaking, $R_{90\%}$, can be measured. On the other hand, the back electromotive force $E_{90\%}$ is obtained from a memory as explained above. The expression $R_{90\%}$ can also be obtained from a table as explained later.

Similarly, the second threshold for total discharge detection is determined using the formula shown in equation (3)

$$U_{min} = E_{30\%} - R_{30\%} I. \tag{3}$$

In this formula, $E_{30\%}$ is the battery's electromotive force for a state of charge of the order of 30%, i.e. for a state of charge lower than normal and $R_{30\%}$ is the battery's internal resistance for the same state of charge.

The value $E_{30\%}$ is determined with the help of a memory containing a table of the relationship between the state of charge and the electromotive force. This correlation table, which preferably also includes the temperature as an entry value, is loaded in the memory in the factory and is the result of empirical determinations as in the case of the back electromotive force.

Note that comparison of the internal resistance measurement with a normal value can also be used to diagnose the ageing of the battery. It is a known fact that the internal resistance of a battery increases significantly in the last third of its life.

The invention applies in particular to NiMH and NiCD type batteries.

According to another feature of the invention, which can be used independently of the various features explained above, to measure the internal resistance of the power battery, an auxiliary battery, usually having a lower voltage than the power battery and sometimes called a "slave" battery, is used and the power battery is charged via this "slave" battery by supplying to the slave battery two electric currents of intensities $I_2$ and $I_1$ respectively and measuring the voltages $U_2$ and $U_1$ with these two currents at the terminals of the power battery. The internal resistance, R, then has the value given by equation (4).

$$R = \frac{U2 - U1}{I2 - I1} \quad (4)$$

In this way, the battery's electromotive force and back electromotive force are not involved in measuring the resistance.

To enable the power battery to be charged via the slave battery and also to enable the slave battery to be charged via the power battery, a two-way DC/DC converter must be provided between the two batteries. A "two-way" converter means a converter which converts the high voltage of the power battery into a low voltage equal to that of the slave battery and, vice versa, which converts the low voltage of the slave battery into a high voltage equal to that of the power battery.

Alternatively, the battery's internal resistance can be measured by using the current supplied by the alternator and the rectifier connected to it. But in that case, it is necessary to use a voltage or current stabilizer for accurate measurement (because of the inevitable variations in the voltage output from the alternator), which due to the higher cost is less advantageous than the first embodiment.

According to yet another feature of the invention, which can be used independently of the other features described above, to take into account the fact that the internal resistance of the power battery cannot be measured continuously, although detection of the state of charge, overcharge and total discharge must be carried out more frequently, a correction is applied to the measured internal resistance which depends on the state of charge and, preferably, on the temperature. Thus, the internal resistance of the battery when charged is lower than the internal resistance when discharged.

The internal resistance on charge has the value R according to equation (5).

$$R = R_0 + R_c \quad (5)$$

In this formula, the corrective expression is $R_c$. Its value depends on the state of charge and, preferably, the temperature. Thus, a memory is provided which is loaded in the factory to supply the corrective values according to the state of charge and, preferably, the temperature.

In the same way, when discharging, the internal resistance R' can be expressed by the formula given in equation (6).

$$R' = R'_0 + R_d \quad (6)$$

In this formula, Rd is the corrective expression provided for discharging. This corrective expression also depends on the state of charge and, preferably, the temperature. Therefore, a memory loaded in the factory is provided to supply the corrective expression.

It is obvious that the addition corrective expressions $R_c$ and $R_d$ can be replaced by the multiplication expressions $\lambda_o$ and $\lambda_d$, i.e. $R = \lambda_c R_o$ and $R' = \lambda_d R_o$.

The corrective expression $R_c$ or $R_d$ (or $\lambda_c$ and $\lambda_d$) must be taken into account when measuring the internal resistance. Thus, when the resistance R has been obtained by measurement, $R_0$ or $R'_0$ must be deduced from it by subtracting from it the corrective expression which depends on the state of charge and if necessary the temperature. Therefore, when charging $R_0$ may be determined from equation (7)

$$R_0 = R' - R_c \quad (7)$$

and when discharging, $R'_0$ may be determined from equation (8).

$$R'_0 = R' - R_d \quad (8)$$

The value of the internal resistance R which is used in the various calculations is deduced from equations (5) and (6), i.e. the corrective expression $R_c$ or $R_d$, which depends on the state of charge and preferably the temperature, is added to the value $R_0$ or $R'_0$.

A correction of the value of the internal resistance which depends on the parameter to be calculated can be provided. In that case, for each calculation to be carried out (overcharge, total discharge, charging capacity, discharge power) a table of the specific relationship between the internal resistance correction value and the state of charge and preferably the temperature is supplied.

In addition, to take into account the effect of the polarization of the battery, the correction expression can be made dependent on the time at the end of which the parameter concerned must be calculated.

For example, when calculating the power available when charged, the corrective expression to be applied to the internal resistance depends on the purpose of the calculation, i.e. among other things, the time at the end of which the charging capacity needs to be known. Thus, by way of illustration, charging carried out by means of an alternator driven by an internal combustion engine requires the calculation of the charge to be carried out over a relatively long time period, while the calculation of the charging capacity available when braking, during which the energy dissipated is recovered to charge the battery, requires the charging capacity to be known for a few seconds.

To take another example of the calculation of the charge, a table showing the relationship between the temperature and the correction to be made to the internal resistance value according to the overcharge requiring detection will be provided. In the example above, it is a correction for a state of charge of 90%.

Similarly, for discharge, correlation tables for the corrective expression to be applied to the internal resistance, which for calculation of the power available on discharge depends on the state of charge, preferably the temperature and the time at the end of which the parameter must be calculated, are supplied. Thus, when the power battery supplies power to the electric traction motor so that the vehicle can overtake, the power available on discharge must be known over a period of a few seconds, e.g. six seconds, and the internal resistance does not have the same value for this period as it does for a period of three seconds or for a longer period.

In the same way, for the detection of total discharge, a correlation table is provided which gives, according to the temperature, the corrective expression to be applied to the internal resistance for the state of charge (e.g. 30%) corresponding to the threshold set for triggering the warning or starting charging as a priority.

The value of the internal resistance is a parameter which enables a battery's state of aging to be determined, because over the last third of its lifetime, this resistance increases noticeably. Therefore, the correction which must be made to this value makes it possible to improve the calculation of the state of aging.

The corrective expression can be adapted to the way aging is analyzed. In fact, the aging analysis carried out automatically in the vehicle consists of comparing the internal resistance with a threshold value, whereas the aging analysis which can be carried out in an after-sales department consists of comparing the internal resistance variation curve with a typical curve obtained empirically.

If the internal resistance is measured using the slave battery, for accuracy of measurement it is preferable, in the case of a hybrid vehicle, that the internal combustion engine be stopped and also that the electric traction motor not be supplied with power. In that case, then, the measurements are taken with the ignition switched off. To achieve this, use can be made of the "auto-wake-up" function generally provided on such battery-powered vehicles, to determine the battery's self-discharge. This auto-wake-up function starts automatically after the vehicle stops, one hour after switching on the ignition, for example, and at intervals of one hour, for example.

Therefore, in one embodiment, when the auto-wake-up operates, besides the self-discharge calculation, the following operations are carried out: calculation of the battery's internal resistance and balancing of the charge in the battery cells when they are highly charged but different from one another.

In a variant of the method, the calculation of the internal resistance is carried out less frequently than the auto-wake-up times, for example annually or after a set number of ampere-hours have been exchanged or even only by an after-sales department.

In the case of an after-sales department, an input to trigger the internal resistance calculation and an output on which the result of the calculation can be obtained are provided.

The invention thus generally relates to a method for determining at least one operating parameter of the power battery of a vehicle with an electric traction motor. This method is such that:

the battery parameter comprises at least one of the following parameters: charging capacity; discharge power; state of overcharge or state of total discharge and the internal resistance of the power battery and the intensity of the current supplied or received is determined in order to calculate the parameter(s).

If the parameter is the battery's state of charging capacity and/or discharge power, the calculation of the charging capacity and/or discharge power can make use of equation (1).

$$P = U \frac{E \pm U}{R} \tag{1}$$

in which equation U is the voltage at the terminals of the power battery, E is the electromotive force or back electromotive force and R is the internal resistance, the + sign indicating battery charge and the − sign indicating battery discharge.

If the parameter is the state of overcharge, the battery terminal voltage threshold $U_{max}$ can be determined from equation (9)

$$U_{max} = E_{N\%} + R_{N\%} I \tag{9}$$

in which formula $E_{N\%}$ is the battery's back electromotive force for a given state of charge higher than normal, $R_{N\%}$ is the battery's internal resistance for the same state of charge and I is the intensity of the current absorbed by the battery.

If the parameter is the state of total discharge, the battery terminal voltage threshold $U_{min}$ below which it is considered that the battery is totally discharged can be determined using equation (10)

$$U_{min} = E_{n\%} - R_{n\%} I \tag{10}$$

in which formula $E_{n\%}$ is the electromotive force for a state of charge below a normal value, $R_{n\%}$ is the value of the battery's internal resistance for the same state of charge below the normal value and I is the intensity of the current supplied by the battery.

In one embodiment, the battery's electromotive force or back electromotive force is preset according to the state of charge (SOC).

The electromotive force or the back electromotive force can also be preset according to battery temperature.

According to one embodiment, a corrective expression which depends on the battery's state of polarization is applied to each measured value of the battery's internal resistance.

This corrective expression can be made to depend on the temperature.

The corrective expression may depend on the parameter to be calculated and if necessary the time at the end of which the parameter must be calculated.

The determination of the internal resistance can be used to detect the battery's state of ageing.

In one embodiment, the internal resistance of the battery is determined using an low voltage auxiliary battery connected to the power battery via a two-way DC/DC converter. The calculation of the internal resistance is preferably carried out when the battery is disconnected from the ignition.

The calculation of the internal resistance can be carried out at intervals automatically, for example simultaneously with power battery self-discharge calculation times.

According to one embodiment, the calculation of at least one of the vehicle's power battery operating parameters comprising the determination of the power battery's internal resistance and the intensity of the current supplied or received in order to calculate the parameter(s) is triggered by means of a signal outside the vehicle and the result of the calculation is obtained outside the vehicle.

The invention also relates to the application of the method to the calculation of the parameters of the power battery of a hybrid type vehicle comprising, besides the electric traction motor, an internal combustion engine for propulsion which is also used to charge the battery via an alternator.

BRIEF DESCRIPTION OF THE DRAWINGS

Further features and advantages of the invention will emerge from the description of some of its embodiments, from the accompanying drawings and from the claims.

FIG. 1 is a diagram showing some components of a hybrid vehicle according to the invention, FIGS. 2 and 3 are diagrams showing the characteristics of a power battery and FIGS. 4a, 4b and 4c are diagrams showing some of the control components of a device according to the invention.

DETAILED DESCRIPTION OF THE INVENTION

The example to be described with the diagrams relates to a hybrid type vehicle comprising two power plants, namely one internal combustion engine 10 and one electric motor (not shown) fed by a power battery 12.

The internal combustion engine 10 drives an alternator 14 which charges the power battery 12 via a rectifier 16.

The vehicle also comprises a low voltage battery 18 designed to supply power to the vehicle's various control and regulation circuits. Between the power battery 12 and the slave battery 18, a two-way DC/DC converter 20 is provided. The converter 20 enables battery 18 to be charged by means of battery 12 and in doing so it lowers the voltage. In the other direction, the converter 20 increases the voltage supplied by battery 18 to supply power to battery 12.

When battery 18 supplies current to the high voltage battery 12, this current is stable, although the current supplied via the rectifier 16 is much less stable due to the variations in the speed of the internal combustion engine 10.

The diagrams in FIGS. 2 and 3 represent a certain number of characteristics of the power battery 12.

Marked on the abscissa of the diagram in FIG. 2 is the state of charge (SOC) of battery 12 expressed in percent and marked on the ordinate is the voltage at the terminals $12_1$ an $12_2$ of the battery. It can be seen that, for a state of charge between 30% and 80%, the voltage U supplied by the battery for zero intensity output current shows a reasonably constant value $U_N$, although this voltage decreases with the state of charge when the latter is less than 30% and increases with the state of charge when it is higher than 80%.

Given that curve 22 shown in the diagram in FIG. 2 relates to a zero intensity current (or, generally, constant current), it does not show the characteristics of battery 12 correctly when it is charging or discharging, i.e. when in use. To enable better knowledge of the various characteristics of the battery, the aim is to measure the battery's internal resistance, preferably via the low voltage battery and therefore via the two-way converter 20.

This knowledge of the battery's internal resistance enables accurate calculation of the charging capacity and the discharge power of this battery and also contributes to optimizing the power of the vehicle. In fact, the management of the battery's electrical energy is a difficult problem to solve because it must meet conflicting requirements, namely maximizing the range (and therefore minimizing the consumption) and maximizing performance (resulting in high consumption). To calculate the battery's charging capacity and discharge power accurately, the state of charge also needs to be known. Knowing the state of charge also makes it possible to determine the voltage threshold above which the battery is overcharged and the voltage threshold below which the battery is totally discharged. As shown above, in order to know these thresholds accurately, accurate calculation of the battery's internal resistance is required.

The state of charge (SOC) of battery 12 is determined by the sum of the ampere-hours received and supplied by this battery.

Finally, knowing the internal resistance makes it possible to determine the state of ageing of the power battery because, as shown on the diagram in FIG. 3, on which the number of ampere-hours exchanged by the battery is marked on the abscissa and the internal resistance $R_i$ is marked on the ordinate, during the first two-thirds 24 of its use the internal resistance has a practically constant value and this resistance increases noticeably during the last third of its life (section 26). Thus, a warning can be triggered when the internal resistance exceeds a set threshold 28.

Now refer to FIGS. 4a, 4b and 4c, which are diagrams showing the devices used to carry out the various calculations in accordance with the invention.

FIG. 4a is a diagram showing the device for determining the internal resistance of battery 12, in which calculation and memory facilities 50 are provided to make it possible, on the one hand, to calculate the internal resistance according to formula (5) described above, by means of inputs $50_1$ and $50_2$ receiving signals indicating the voltage value U and the current intensity I respectively. The output values $R_0$ or $R'_0$ are thus obtained, as shown by formulas (7) and (8) above.

Given that, in the example, corrective expressions are added to value $R_0$ or $R'_0$ which depend on the state of charge (SOC) and the temperature T, an input $50_3$ is therefore provided, to which a signal is sent, indicating the conditions for calculating the value $R_0$, i.e. the state of charge (SOC) and the purpose of the calculation, i.e. maximum charging capacity detection, maximum discharge power detection, overcharge detection, total discharge detection or ageing calculations. The signal applied to input $50_3$ may also include an external trigger signal which may be used to initiate the calculation. In addition, in charging or discharging conditions, the purpose of the calculation is taken into account, i.e. the time at the end of which the state of charge or discharge needs to be known.

The temperature detected is sent to an input $50_4$ of the equipment 50. Equipment 50 also includes one or more memories containing correlation tables supplying correction values to be applied to the internal resistance according to the state of charge, the temperature and the time at the end of which the internal resistance needs to be known.

Equipment 50 also comprises an output $50_6$, supplying a value $I_{target}$ which is the current setting serving as a basis for the calculations. If the measured intensity I sent to input $50_2$ is different from the set value, either the setting is changed or the calculation is aborted.

Finally, a delay element 52 is provided between the output $50_7$, supplying the value $R_0$ and an input for comparison. The delay element enables the previously measured value $R_0$ to be compared with the new calculated value. The calculation is accepted if the new value is higher than the previous one. The internal resistance of a battery does in fact increase all the time, so if a decrease is observed, the computer decides that the calculation is incorrect. Note here that the internal resistance is not measured continuously but at intervals, e.g. every three to six months or annually.

The diagram in FIG. 4b represents a device for determining the state of charge (SOC).

This device comprises a unit 62 for calculating the state of charge (SOC) by current measurement, comprising an input $62_1$ receiving a signal indicating the current intensity and an input $62_2$ receiving a signal indicating the driving phase. The job of this unit 62 is to count charging ampere-hours and discharging ampere-hours. Thus, the signal obtained at the output $62_3$ of unit 62 is the signal indicating the state of charge.

FIG. 4c is a diagram showing the various pieces of equipment which use the $R_0$ and SOC signals, supplied by units 50 and 62 respectively, to manage the vehicle's control system and the warning signals in particular (generally at constant current).

A first unit 64 is therefore provided which supplies a maximum charging capacity calculation signal based on signals to its inputs $64_1$ to $64_5$. These signals are for $R_0$, U, T, SOC and the driving phase, respectively.

Unit 66 supplies a calculation of the maximum discharge power. The inputs also receive signals for $R_0$, U, T, SOC and driving conditions.

Unit 68 is designed to supply an overcharge warning signal based on $R_0$, I, U, T and driving conditions data.

Similarly, unit 70 supplies a state of total discharge signal based on signals for $R_0$, I, U, T, SOC and driving conditions.

Ageing diagnostic unit 72 supplies an ageing signal based on $R_0$, I, and driving conditions input signals.

These signals supplied by units 64, 66, 68, 70 and 72 are sent to the respective inputs of an alarm and warning management unit 74. For example, in the case of overcharge, the available charging capacity is adjusted to zero and in the case of total discharge, the discharge power is adjusted to zero.

What is claimed is:

1. A method for monitoring a power battery of a vehicle having an electric traction motor, comprising the steps of:
    measuring an internal resistance of the power battery;
    measuring a current supplied by or received from the power battery; and
    determining at least one operating parameter of the power battery selected from a group consisting of charging capacity and discharge power state, responsive to the measured internal resistance and current;
    wherein the step of determining the at least one parameter uses the following equation:

$$P = U \frac{E \pm U}{R}$$

wherein U is a voltage provided by the power battery, E is an electromotive force or back electromotive force, R is an internal resistance, the + sign indicates battery charge and the − sign indicates battery discharge.

2. A method for monitoring a power battery of a vehicle having an electric traction motor, comprising the steps of:
    measuring an internal resistance of the power battery;
    measuring a current supplied by or received from the power battery; and
    determining a state of overcharge of the power battery, which has a first state if the battery provides a voltage greater than a battery terminal high voltage threshold $U_{max}$ and has a second state otherwise, wherein the terminal high voltage threhsold $U_{max}$ is determined from the following formula:

$$U_{max} = E_{N\%} + R_{N\%} I,$$

in which $E_{N\%}$ is the battery's back electromotive force for a given state of charge higher than normal, $R_{N\%}$ is the battery's internal resistance for the same state of charge and I is a measure of current absorbed by the battery.

3. A method for monitoring a power battery of a vehicle having an electric traction motor, comprising the steps of:
    measuring an internal resistance of the power battery;
    measuring a current supplied by or received from the power battery;
    determining at least one operating parameter of the power battery selected from a group consisting of charging capacity, discharge power, state of overcharge and state of total discharge responsive to the measured internal resistance and current; and
    applying a corrective expression, which depends on a state of polarization of the battery, to correct each measured value of the battery's internal resistance.

4. A method for monitoring a power battery of a vehicle havin an electric traction motor, comprising the steps of:
    measuring an internal resistance of the power battery including the step of connecting an auxiliary low voltage battery to the power battery via a two-way DC/DC type converter;
    measuring a current supplied by or received from the power battery; and
    determining at least one operating parameter of the power battery, selected from a group consisting of charging capacity and discharge power state responsive to the measured internal resistance and current.

5. A method according to claim 1, 2, 3 or 4, further including the step of measuring a state of charge (SOC) of the battery to identify a preset value to use as an electromotive force or back electromotive force of the battery.

6. A method according to claim 5, further including the step of measuring a temperature of the battery to identify a preset value to use as the electromotive force or back electromotive force of the battery.

7. A method according to claim 3, further including the steps of:
    measuring a temperature of the battery; and
    calculating the corrective expression responsive to the temperature.

8. A method according to claim 3, further including the step of calculating the corrective expression responsive to the at least one parameter to be calculated.

9. A method according to claim 8, further including the step of calculating the corrective expression responsive to a time at which the at least one parameter must be calculated.

10. A method according to claim 1, further including the step of determining a state of aging of the battery responsive to the internal resistance of the battery.

11. A method according to claim 1 or claim 4, wherein the vehicle includes an ignition circuit and the step of measuring the internal resistance is carried out when the ignition circuit is switched off.

12. A method according to claim 11, wherein the step of measuring the internal resistance is carried out automatically at intervals.

13. A method according to claim 1, 2, 3, or 4, wherein at least one of the steps of measuring the internal resistance of the power battery and measuring the current supplied by or received from the battery is triggered by a signal outside the vehicle and the step of determining the at least one operating parameter is performed outside the vehicle.

14. A method according to claim 1, 2, 3 or 4 wherein the power battery is for a hybrid type vehicle comprising, an internal combustion type engine for propulsion and an alternator, coupled to the internal combustion engine, further including the step of charging the battery from a current generated by the alternator.

* * * * *